(12) United States Patent
Chakrabarty et al.

(10) Patent No.: US 8,782,479 B2
(45) Date of Patent: Jul. 15, 2014

(54) SCAN TEST OF DIE LOGIC IN 3D ICS USING TSV PROBING

(71) Applicant: Duke University, Durham, NC (US)

(72) Inventors: Krishnendu Chakrabarty, Chapel Hill, NC (US); Brandon Noia, Durham, NC (US)

(73) Assignee: Duke University, Durham, NC (US)

( * ) Notice: Subject to any disclaimer, the term of this patent is extended or adjusted under 35 U.S.C. 154(b) by 128 days.

(21) Appl. No.: 13/666,696

(22) Filed: Nov. 1, 2012

(65) Prior Publication Data

US 2014/0122951 A1 May 1, 2014

(51) Int. Cl.
*G01R 31/28* (2006.01)
(52) U.S. Cl.
USPC .......................................................... 714/727
(58) Field of Classification Search
CPC ................ G01R 31/31855; G01R 31/318555; G01R 1/07378; G01R 31/318508; G01R 31/318513; G01R 31/318511; H01L 2224/16225; H01L 2224/32225; H01L 2224/73204; H01L 2924/00; H01L 21/563
See application file for complete search history.

(56) References Cited

U.S. PATENT DOCUMENTS

| | | | |
|---|---|---|---|
| 2011/0080185 A1* | 4/2011 | Wu et al. | 324/750.3 |
| 2012/0242367 A1* | 9/2012 | Goel | 326/16 |
| 2012/0280231 A1* | 11/2012 | Ito et al. | 257/48 |
| 2013/0024737 A1* | 1/2013 | Marinissen et al. | 714/727 |
| 2013/0293255 A1* | 11/2013 | Wu et al. | 324/762.01 |

OTHER PUBLICATIONS

Chakrabarty and Noia, "Pre-Bond Probing of TSVs in 3D Stacked ICs," Test Conference (ITC), 2011 IEEE International, Sep. 20-22, 2011.

* cited by examiner

*Primary Examiner* — Guerrier Merant
(74) *Attorney, Agent, or Firm* — Saliwanchik, Llyod & Eisenschenk, P.A.

(57) ABSTRACT

A test architecture for 3D ICs is provided in which Through-Silicon-Vias and die logic can be tested pre-bonding dies in the stack for the 3D ICs. Post-bond scan test architecture is reconfigured to be accessed during pre-bond testing through using stratigically placed MUXs and TSVs. By connecting post-bond architecture including scan flops and boundary registers to gated scan flops used in TSV testing, an internal chain of scan flops such as typically used in post-bond testing can be selectively connected to gated scan flops connected to one end of each TSV for pre-bond testing of the internal logic through the TSVs.

16 Claims, 6 Drawing Sheets

SCAN TEST OF DIE LOGIC IN 3D ICS USING TSV PROBING

This invention was made with government support under Federal Grant No. CCF-1017391 awarded by the National Science Foundation. The government has certain rights in the invention.

BACKGROUND

As semiconductor technology continues to scale, interconnect delay and power consumption threaten to limit the benefits of further scaling. To overcome these bottlenecks, the semiconductor industry is exploring 3D integration through die stacking and through-silicon-vias (TSVs).

A TSV is a metal pillar that connects to a metal layer and is embedded in the device substrate. In a 3D stacked IC (SIC), two or more dies are produced with their own active device and metal layers and then bonded together with vertical TSVs connecting metal layers of adjacent dies. To expose the TSV pillar, much of the substrate is ground away in a process called "thinning" After thinning, metal balls called "microbumps" are added to the end of the TSV for use in bonding.

Because of the move to vertical as opposed to horizontal connections between devices, 3D SICs can lead to a decrease in interconnect length, power consumption, and footprint. To take advantage of these benefits, product quality should be provided at an appropriately high yield. As with any fabricated component, defects may occur during the manufacturing process of die logic and TSVs that can degrade product quality. Therefore, testing schemes are important in order to manufacture reliable chips.

Testing may be carried out before or after dies are assembled onto a stack. Pre-bond testing is directed to detecting defects that are inherent in the manufacture of the internal logic and TSVs, enabling the screening of defective chips and potentially significantly increase stack yield. If a single faulty die is bonded to a stack of otherwise good dies, the whole stack may need to be discarded when a fault is detected during post-bond test. By performing pre-bond testing, it can also be possible to match dies for performance and power.

During pre-bond testing of TSVs, probing can be performed either on the microbumps, the bare TSV pillar, or added probe pads. The thinned wafers are significantly more fragile than standard wafers, so they are generally mounted on a carrier before probing and/or testing with probe cards that apply low contact forces. To inhibit mechanical damage to the microbump or TSV surface, the number of probe touchdowns on the same TSV is limited.

Surface planarity of TSV microbumps impacts not only the quality of connection between a TSV and a probe needle, but also the quality of TSV contacts after bonding. It is therefore desirable not only to planarize microbumps before bonding and TSV test, but also for probes and test methods to be tolerant of non-planarity.

In addition, contacting TSVs with probes prior to bonding can be difficult due to the small pitch and density of TSVs. As an approach to handling the difference in size between current probes and TSVs, previous techniques have introduced large probe pads to TSVs for probe needles. However, large probe pads can limit test access and TSV placement.

Built-in self-test (BIST) techniques have also been proposed for TSV testing and BIST methods for 2D circuits can be extended to pre-bond dies and die logic, but they can require a relatively large amount of die area, and on-chip analog BIST logic is subject to process variations.

BRIEF SUMMARY

Embodiments of the invention provide methods and architectures for a reconfigurable pre-pond probing of TSVs and logic in 3D ICs. A gated scan flop provided as embedded test architecture that can be used for TSV testing, as well as the TSVs themselves, are also used to perform pre-bond test of internal logic of the 3D IC in accordance with certain embodiments of the invention.

Successful pre-bond defect screening in accordance with embodiments of the invention can allow defective dies to be discarded before stacking Moreover, pre-bond testing and diagnosis can facilitate defect localization and repair prior to bonding In accordance with certain embodiments of the invention, a die level wrapper is provided including gated scan flops connected to one end of each TSV. The gated scan flops include a scan flop structure and a gated output. The scan flop structure can be any suitable scan flop used for scan design that is modified to include a gated output such that the output of the scan flop is controlled by an "open" signal to either be in a "floated state" or take the value stored in the flip-flop. In one embodiment, the gated output is provided by a transmission gate. An internal chain of scan flops such as typically used in post-bond testing can be selectively connected to the gated scan flops connected to one end of each TSV for pre-bond testing of the internal logic.

In one embodiment, a multiplexer is used in designated locations to provide the reconfigurable connections for TSV and internal logic pre-bond testing.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

A pre-bond scan test architecture and reconfigurable testing scheme for 3D ICs are presented in which TSVs and die logic testing can be facilited. According to an embodiment, pre-bond TSV testing, either direct or through bumps, can be performed using a gated scan flop (GSF) die wrapper style architecture and pre-bond die logic testing can be performed by selectively connecting a scan chain to GSFs of a TSV network.

Figure 1:
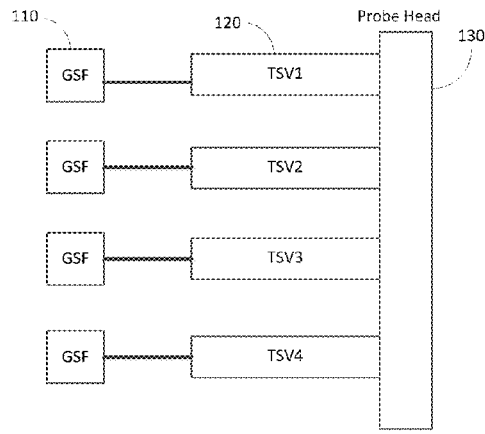
FIG. 1 shows a representation of a TSV network created by shorting together, via a probe needle, TSVs incorporating test architecture of an embodiment of the invention.

Dies in a 3D SiC can be tested both pre-bond (e.g., before the dies are assembled onto a stack and post-bond. Successful pre-bond defect screening in accordance with embodiments of the invention can allow defective dies to be discarded before stacking. Moreover, pre-bond testing and diagnosis can facilitate defect localization and repair prior to bonding In accordance with certain embodiments of the invention, a die level wrapper is provided including gated scan flops (GSFs) connected to one end of each TSV such as shown in FIG. 1. By incorporating a GSF 110 connected to each TSV 120, a pre-bond TSV test can be carried out by using probe needles (probe head) 130 larger than an individual TSV so that groups of TSVs can be deliberately shorted together to form a single circuit called a network. A controller can be used to control the GSFs and enable selection of a TSV under test.

The gated scan flops 110 include a scan flop structure and a gated output. The scan flop structure can be any suitable scan flop used for scan design. However, in accordance with the invention, the scan flop includes a gated output such that the output of the scan flop is controlled by an "open" signal to either be in a "floated state" or take the value stored in the flip-flop. In one embodiment, the gated output is provided by a transmission gate. The controller (not shown) may include a synchronous up-counter connected to a decoder directing the "open" signal to a particular gate element of the gated scan flop 110.

Figure 2A:
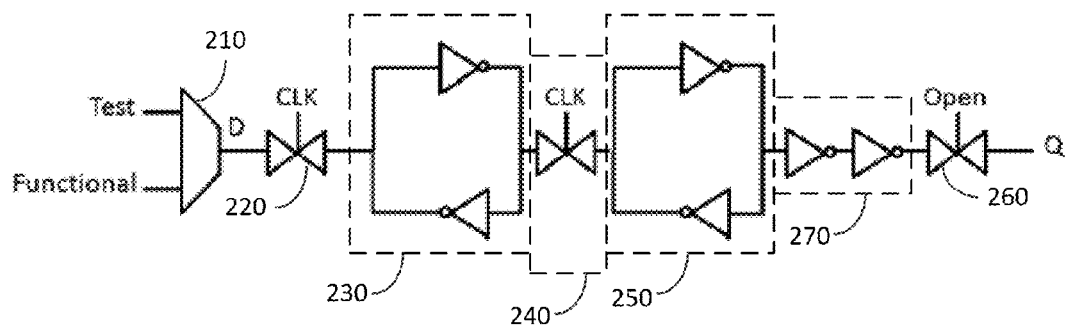
FIGS. 2A and 2B show an example design of a gated scan flop at a gate level and a transistor level, respectively.
Figure 2B:
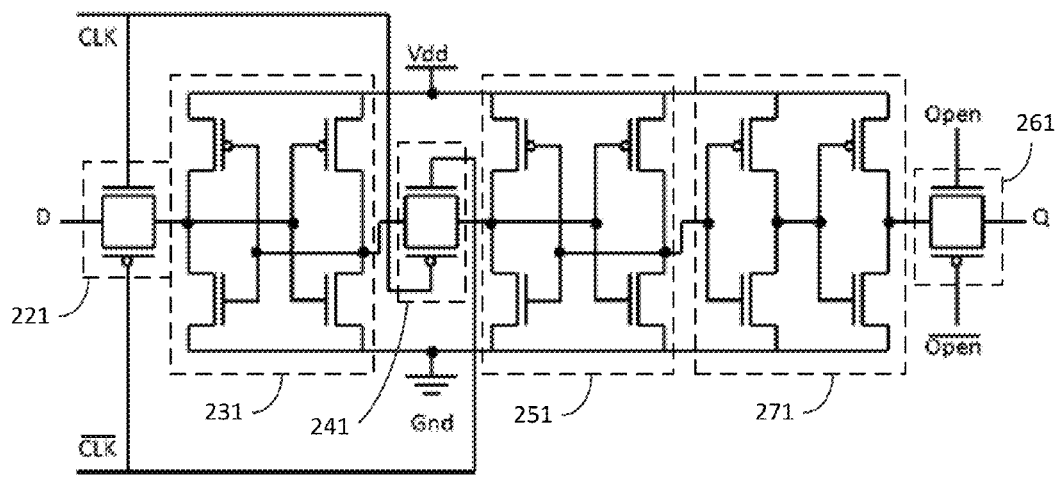

FIG. 2A shows a gate level design of a GSF and FIG. 2B shows a transistor-level implementation. As in a typical scan flop, a GSF multiplexes between a test and functional input and can be connected to other GSFs to form a scan chain. The difference is that the GSFs include a buffer of two inverters and a transmission gate at the output of the flop, which accepts a new 'open' signal to switch between a low- and a high-impedance output. This design effectively allows the TSV to be driven by the GSF or to be left floating. GSFs on receiving TSVs, or those TSVs that would be driven by another die in the stack, are bidirectional in that the GSF can drive the TSV during test.

As shown in FIG. 2A, a GSF can include a multiplexer (MUX) (test enable control signal not shown) 210 receiving Test and Functional inputs to output a selected one as input "D," which is passed via a first transmission gate 220 controlled by the clock CLK to a first delay latch 230. The signal is then passed via a second transmission gate 240 also controlled by the clock CLK to a second delay latch 250. The delay latches 230, 250 can be in the form of cross-coupled inverters for storing the data. In accordance with embodiments of the invention, a gated output is used to control whether the output Q floats or takes the value stored in the flop. In the embodiments shown in FIG. 2B, the gated output is a third transmission gate 260 that is controlled by the signal Open.

Output buffers 270 can be provided before the signal is output to Q. These buffers can be configured such that the gated scan flop can drive a large capacitance on its output net without altering the value held in the flop. The output buffers 270 and third transmission gate 260 may alternatively be replaced with a tri-state buffer where the Open signal is provided at the control input.

The transistor level design shown in FIG. 2B begins from input D before passing through the first transmission gate 221 to first cross-coupled inverter stage 231. In one embodiment, the widths of the transistors in the first cross-coupled inverter stage 231 can be greater than the widths of the transistors in the second cross-coupled inverter stage 251 such that the second stage takes the value of the first stage when the buffer between them is open (e.g., transmission gate 231) and they are in contention. In another embodiment, the width of the top inverter in the diagram for each of the cross-couplings 230, 250 is larger than the width of the bottom inverter (e.g., the right transistor pair in each cross-coupling 231, 251 can be formed of transistors having larger widths than the left transistor pair). Each cross-coupling pair can be substantially identical with respect to transistor sizing. When the two cross-couplings 230, 250 (231, 251) are in contention, the top inverter of the first cross-coupling is a stronger driver of the bottom inverter of the second cross-coupling.

Two internal inverter buffers 271 can be included before the third transmission gate 261 at the gated scan flop output such that the gated scan flop can drive a large capacitance on its output net without altering the value held in the flop. The "open" signal controls the third transmission gate 261, whereas the CLK controls the first and second transmission gates 221, 241. In certain embodiments, a single transistor may be used for one or more of the transmission gates instead of the NMOS/PMOS pair. In accordance with embodiments of the invention, an internal chain of scan flops or other logic test architecture as typically used in post-bond testing is selectively connected to the gated scan flops connected to one end of each TSV for pre-bond testing of the internal logic. In one embodiment, a MUX is used in designated locations to provide the selective connections for using the internal scan flops during pre-bond testing of die logic. The MUX connects the internal scan flops to boundary scan flops (including the gated scan flops) when a select signal is applied.

Figure 3A:
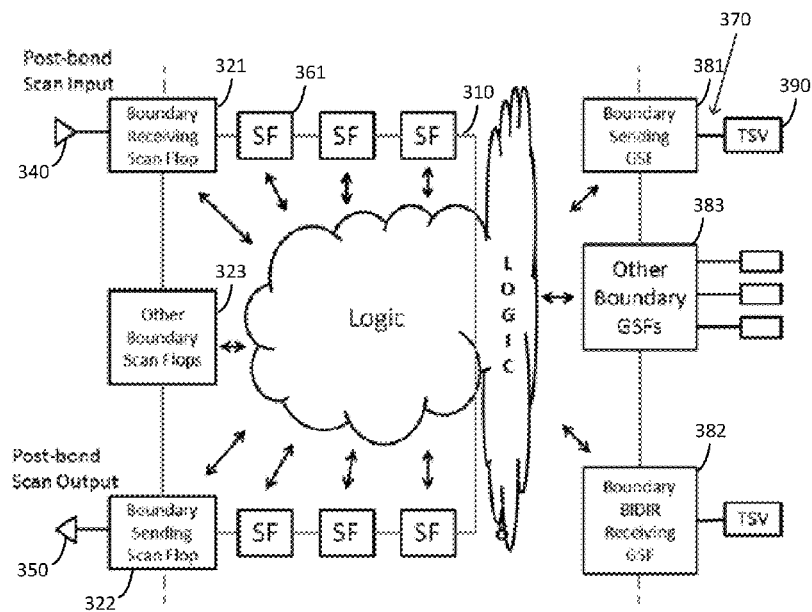
FIGS. 3A and 3B show representations of a post-bond scan architecture and movement of test data, respectively.
Figure 3B:
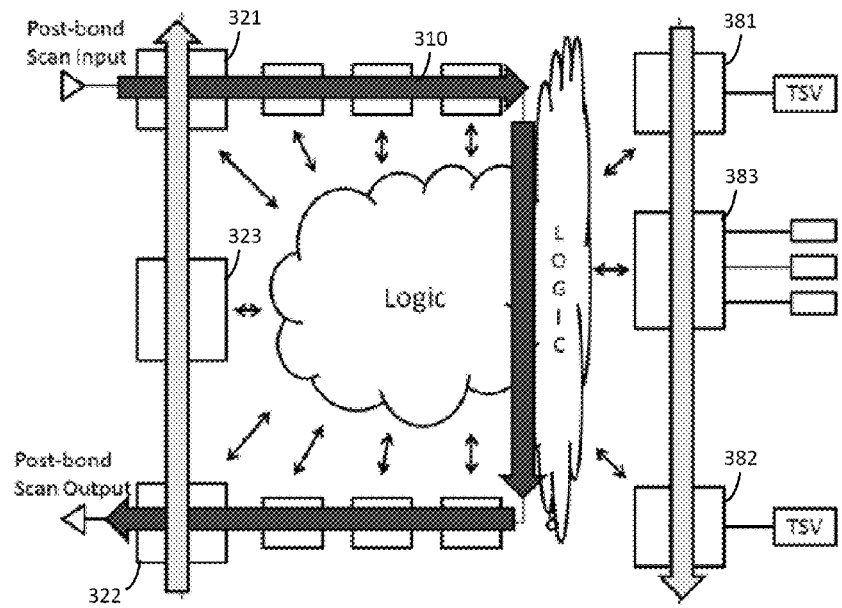

FIGS. 3A and 3B show representations of a post-bond scan architecture and movement of test data, respectively. The post-bond test architecture uses a die wrapper configuration. As shown in FIG. 3A, a single scan chain 310 and a number of boundary scan flops (321, 322, 323) can be used for post-bond testing of logic 330 on a chip. The scan chain 310 for the internal logic 330 can follow a configuration in which boundary scan registers 321, 322 are used at functional terminals (e.g., 340, 350) to the internal logic 330 to feed through to scan flops (SFs) 361 that are used to shift data through the internal scan chain 310. The scan flops 310 are used interact with die logic 330.

Boundary scan registers at the TSV interface 370 can be confiured as gated scan flops(381, 382, 383), which may be included before each TSV 390 to enable pre-bond probing of TSVs.

Although not shown in the figures, landing pads are supplied for providing operational signals to the die, such as power, ground, and clocks. The post-bond scan input 340 and scan output 350 for a scan chain 310 enter and exit the die through a boundary register (e.g., 321 and 322). In the bottom die in a stack, this interface can be through external test pins or a JTAG test-access port. For other dies in the stack, scan I/Os are connected to the dies below it in the stack. Parallel loading of the boundary registers decreases test time, but serial scan test is also available by shifting through the boundary scan chain, for example as illustrated in FIG. 3B.

Referring to FIG. 3B, during post-bond testing, test data can be shifted not only through the internal scan chain 310, but also around the boundary registers (including the GSVs) 321, 322, 323, 381, 382, and 383.

In accordance with embodiments of the invention, by connecting the internal scan chain 310 to the GSFs 381, 382, and 383 provided as embedded test architecture that can be used for TSV testing, pre-bond test of internal logic of the 3D IC can also be performed.

During pre-bond testing, the GSFs (and a controller that is not shown) can be used to perform TSV testing. In order to enable pre-bond scan test of die logic (in a similar manner as is possible during post-bond testing as described with respect to FIGS. 3A-3B), the scan chains 510 are reconfigured into a pre-bond test mode in which scan inputs and scan outputs are connected to TSV networks. This allows the probe station to apply test patterns to the die and read test responses through the scan chains.

Advantageously, not all TSVs need to be contacted for die logic test. Instead, the contacted TSVs are those that are involved in a pre-bond scan. Since many boundary scan registers are logically separated from internal scan chains in the post-bond mode (illustrated in FIGS. 3A-3B), the logically separated boundary scan registers are stitched into the scan path in pre-bond mode to enable pre-bond testing. That is, one or more multiplexers are added into the scan path to allow scan chains to be reconfigured to a pre-bond mode in which their scan-in and scan-out connections are through TSVs. According to embodiments, the multiplexers are added in as few places as possible to achieve access to the internal and boundary scan flops in order to minimize hardware overhead.

Figure 4A:
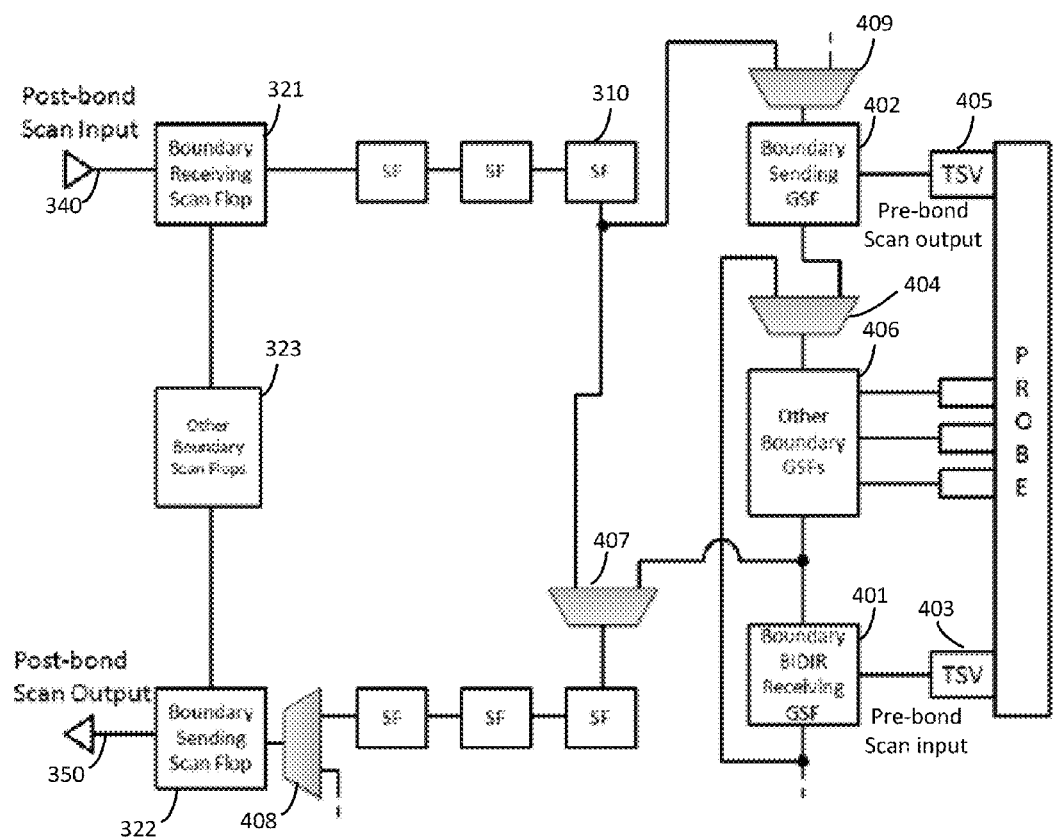
FIGS. 4A and 4B show representations of reconfigurable scan chains for pre-bond test using added multiplexers and movement of test data according to certain embodiments of the invention.

In one embodiment, as shown in FIG. 4A, four multiplexers are used in a single scan chain to connect the outer boundary scan registers to the internal scan chains for use during pre-bond testing. However, the four MUXs are merely illustrative of one configuration for stitching in a logic test architecture with TSV test architecture for pre-bond testing and embodiments are not limited thereto. More or less MUXs may be used in various embodiments. For example, multiple scan chains may be stitched together for pre-bond testing using more than four MUXs. As another example, For an architecture where all (or substantially all) boundary registers can be multiplexed to a scan chain at an end of the scan chain, then less MUXs may be used. In many embodiments, at least two MUXs are present: one to route a receiving GSF to the input of a pre-bond scan chain and one to route the output of a pre-bond scan chain to a sending GSF.

Figure 4B:
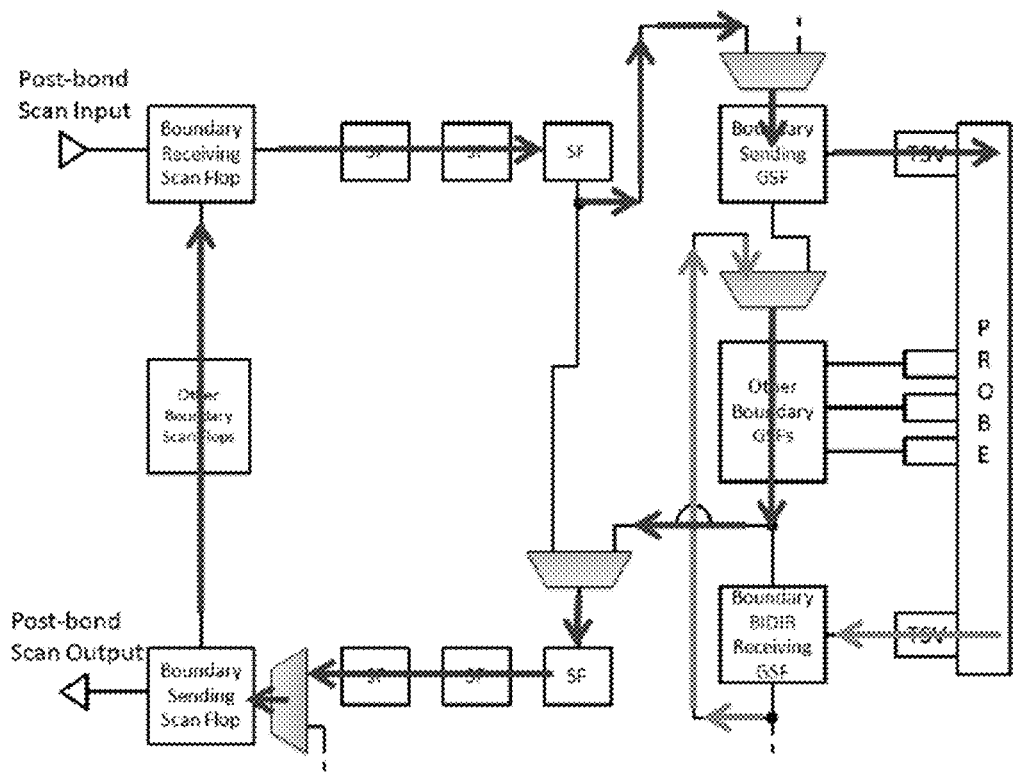
Figure 4C:
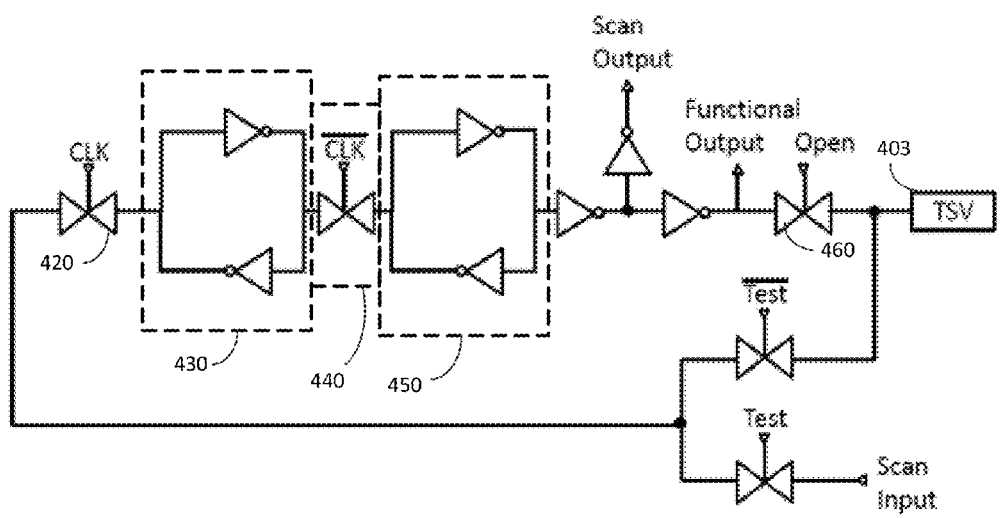
FIG. 4C shows an example design of a receiving gated scan flop according to an embodiment of the invention.

FIG. 4C shows an example of a receiving GSF (e.g., bidirectional receiving GSF 401) according to an embodiment of the invention. Similarly to the GSF of FIG. 2A, the receiving GSF includes a first transmission gate 420 controlled by the clock CLK, passing a scan input to a first delay latch 430. The signal is then passed via a second transmission gate 440 also controlled by the clock CLK to a second delay latch 450. The delay latches 240, 450 can be in the form of cross-coupled inverters for storing the data. A gated output is used to control whether the output to the TSV 403 floats or takes the value stored in the flop. In the embodiments shown in FIG. 4C, the gated output is a third transmission gate 460 that is controlled by the signal Open.

In functional mode, the GSF receives an input from the TSV 403, while the third transmission gate 460 is in a high impedance state. In test mode, the GSF can act as a receiving flop for scan test, or it can be used to drive the TSV for TSV testing.

Returning to FIG. 4A, a receiving GSF 401 can be chosen for the reconfigured scan-in and a sending GSF 402 is chosen for the scan-out. The receiving GSF 401, which now acts as the pre-bond scan input, is enabled (for example by a controller) to accept its functional input driven through the TSV 403. Its scan output is then multiplexed into the boundary scan chain through MUX 404, and the output passed through other boundary GSFs 406 and MUX 407. This is done such that the sending GSF 402, which is used as a pre-bond scan output (through TSV 405), and the receiving GSF 401, which is used as a pre-bond scan input, can interface with scan flops that are adjacent to one another in the post-bond scan chain 310. The output of the boundary scan flop 406 that is used to feed the pre-bond scan input is multiplexed into the scan chain using MUX 407. The post-bond scan output 350, post-bond scan input 340, and other boundary registers (e.g., 321, 322, 323) are stitched into the scan chain 310 using, for example, MUX 408. Finally, the sending GSF 402 used as a pre-bond scan output is multiplexed to the end of the scan chain 310 through MUX 408. The pre-bond movement of test data is shown in FIG. 4B. The combinational logic is not shown to retain clarity.

As illustrated in the embodiments shown in FIGS. 4A and 4B, a reconfigured pre-bond scan chain can have scan-in and scan-out terminals that are part of the same TSV network. Under these conditions, the scanning in of test data and the scanning out of test responses must be done separately. This is because, in order to scan in test data, the transmission gate (e.g., transmission gate 460 of FIG. 4C) on the receiving GSF 401 is set to its low-impedance state while all other gates are set to their high-impedance states. Likewise, while scanning out, the transmission gate for the sending GSF 402 is set to low impedance while all others are set to high impedance.

Since scan-in and scan-out occur on the same network, the maximum number of scan chains that can be tested in a single touchdown of a probe is equal to the number of TSV networks formed. In other words, the number of scan chains can at most be equal to the number of probe needles. Furthermore, if current or power limits cause the maximum scan clock frequency to be different for scan input and scan output, then the appropriate frequency is used for the corresponding operation.

Figure 5:
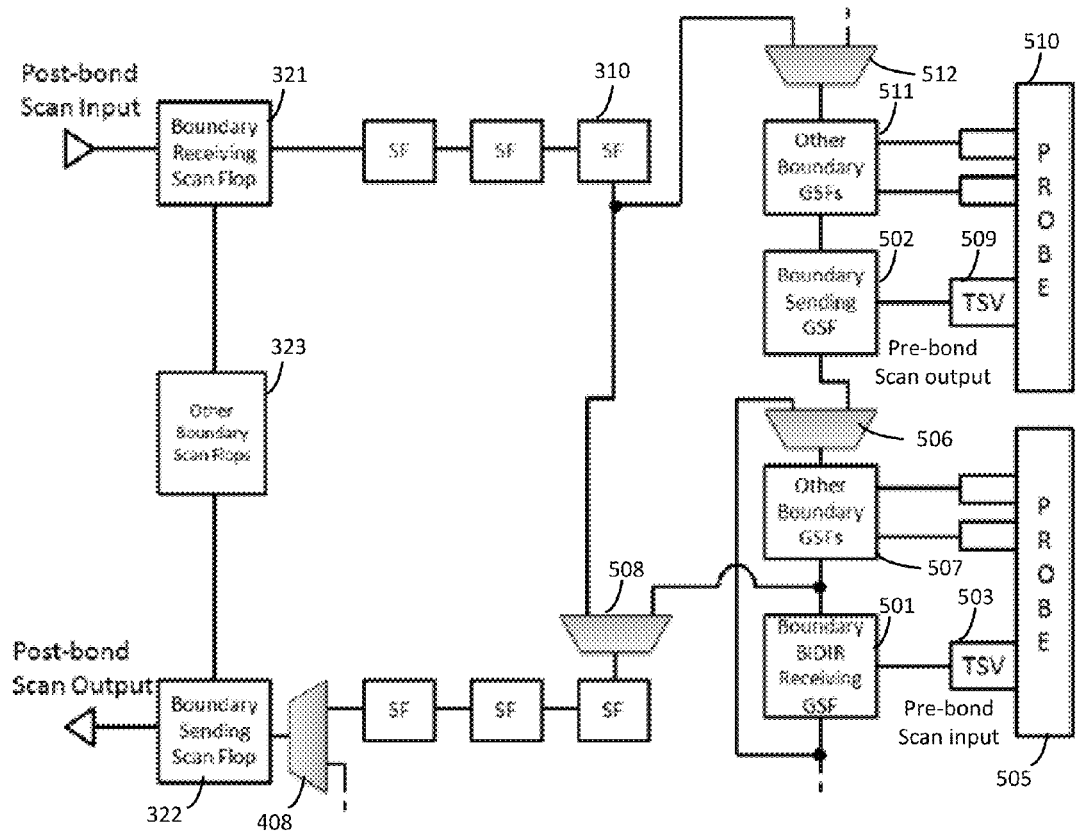
FIG. 5 shows a representation of a reconfigurable scan chain with pre-bond scan input and scan output on different TSV networks according to an embodiment of the invention.

FIG. 5 shows another possible pre-bond scan configuration. Referring to FIG. 5, according to an embodiment, the scan input (via receiving GSF 501) and scan output (via sending GSF 502) can be provided on separate TSV networks. The receiving GSF 501 and the sending GSF 502 are considered to be on separate networks because the two GSFs are contacted by separate probes. In this case, test responses can be scanned out while test patterns are scanned in.

For example, the receiving GSF 501, acting as the pre-bond scan input, is enabled (for example by a controller) to accept its functional input driven through the a TSV 503 connected to one probe 505. Its scan output is then multiplexed into the boundary scan chain through MUX 506, which is passed through other boundary GSFs 507 and MUX 508. This is done such that the sending GSF 502, which is used as a pre-bond scan output (through TSV 509 connected to another probe 510), and the receiving GSF 501, which is used as a pre-bond scan input, can interface with scan flops that are adjacent to one another in the post-bond scan chain 310. The output of the boundary scan flop 506 that is used to feed the pre-bond scan input is multiplexed into the scan chain using MUX 508. The post-bond scan output 350, post-bond scan input 340, and other boundary registers (e.g., 321, 322, 323) are stitched into the scan chain 310 using, for example, MUX 408. Finally, the sending GSF 502 used as a pre-bond scan output is multiplexed to the end of the scan chain 310 through other boundary GSFs 511 and MUX 512.

The maximum number of scan chains that can be tested per touchdown is reduced to half of the number of probe needles (or half of the number of TSV networks). Both scan input and scan output operations are implemented at the lower of the possible scan frequencies, since both operations occur simultaneously.

However, embodiments provide a test architecture that allows a probe card to contact TSVs without the need for probe pads, enabling both TSV and pre-bond scan test, as well as facilitating increased TSV density.

Pre-bond testing can be performed using the test architecture described herein as long as there is access to TSVs (through thinning) or the microbumps deposited on them.

EXAMPLES

Simulations were conducted in HSPICE on a 3D logic-on-logic benchmark with 100 scan chains and using the configurations as illustrated in FIGS. 4A and 5.

For the examples, a 3D IC benchmark was created from a Fast Fourier Transform (FFT) circuit chosen from the Open-Cores set of benchmarks. The FFT circuit is synthesized using the Nangate open cell library at the 45 nm technology node. The total gate count after synthesis is 299,273, with 19,962 flip-flops. The design was partitioned into 4 dies, with the gate counts in each die being 78,752; 71,250; 78,367; and 70,904, respectively. The logic gates in each die are placed using the CADENCE ENCOUNTER platform, a registered trademark of Cadence Design Systems, Inc., and TSVs are inserted in a regular fashion, using a minimum spanning tree approach. Back-to-face bonding is assumed, which means that TSVs are present only in the first three dies. The TSV counts are 936, 463, and 701, respectively. The TSV diameters in this chip are 5 μm. The circuit was routed such that each TSV has a small microbump sized at 7 μm, and the total TSV cell size including keep out zone is 8.4 μm, which corresponds to six standard cell rows. Each die is then routed separately in CADENCE ENCOUNTER.

The resistance and capacitance used for each TSV of 5 μm diameter were 1Ω and 20 fF, respectively. Transistors were modeled using a predictive low-power 45 nm model. Transmission-gate transistor widths were set to 540 nm for PMOS and 360 nm for NMOS. These larger widths were chosen such that the gate, when open, would have minimal to negligible impact on signal strength. For each GSF, a strong and weak inverter were used, with the strong inverter having widths of 270 nm for PMOS and 180 nm for NMOS, and the weak inverter having 135 nm for PMOS and 90 nm for NMOS. The test configuration assigned the top inverter of each cross-coupled pair as the strong inverter and the bottom as the weak inverter (see also FIGS. 2A-2B) These were chosen such that the majority of transistor W/L ratios were 2/1 for NMOS and 3/1 for PMOS. The power supply voltage for both the probe and the circuit was taken to be 1.2 V.

Figure 6:
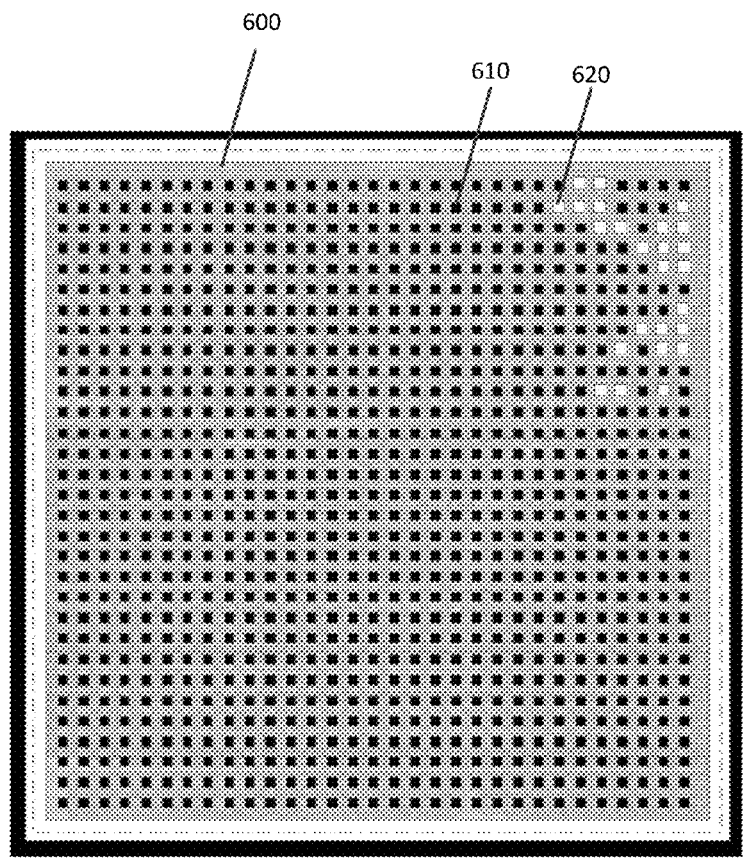
FIG. 6 shows an image of a layout of die 0 of a 4-die FFT benchmark, in which standard cells are highlighted in white and TSVs are in black.

The bottom die 600 of the 4-die layout is shown in FIG. 6, with an array of TSVs 610 and standard signal lines 620.

Boundary scan cells were added at the TSV interface. It was found, by examining die 0 of the 4-die FFT benchmark, that without boundary scan registers, the pre-bond stuck-at fault coverage was only 44.76%. With boundary registers added, the coverage increases to 99.97%. This is a significant increase, especially considering that the experiment die 0 only contains 936 TSVs, and an industry design may contain tens of thousands of TSVs. For die 0, the area overhead of the boundary scan GSFs and scan chain reconfiguration circuits was 2.2% of the total number of gates.

Results show that the ratio of the number of probe needles available for test access to the number of pre-bond scan chains determines which pre-bond scan configuration results in the shortest test time. Maximum pre-bond scan-in and scan-out shift-clock speeds are determined for dies in a benchmark 3D design. These clock speeds show that pre-bond scan test can be performed quickly, at a speed that is comparable to scan testing of packaged dies. The maximum clock speed can also be tuned by changing the drive strength of the probe and on-die drivers of the TSV network. Estimates are also provided for peak and average power consumption during pre-bond scan test. On-die area overhead for embodiments of the invention is estimated to be between 1.0% and 2.2% for three dies in the 3D stack.

The feasibility of performing scan test through probe needles was examined in terms of sourcing and sinking currents. To determine an upper limit on the current drawn, scan chains were inserted into the benchmark. In order to manage the complexity of circuit-level HSPICE simulation, scan chains were limited to a length of 8 (6 internal scan cells and two boundary scan cells for pre-bond scan I/O per chain). Stuck-at and transition test patterns for this design were generated using a commercial ATPG tool and ordered based on toggle activity. Test generation yielded the toggle activity per pattern and fault coverage of 99.97% for stuck-at patterns and 97.65% for transition patterns. For the pattern with highest peak toggle activity, the scan chain that had the largest number of transitions for that pattern was simulated.

Figure 7:
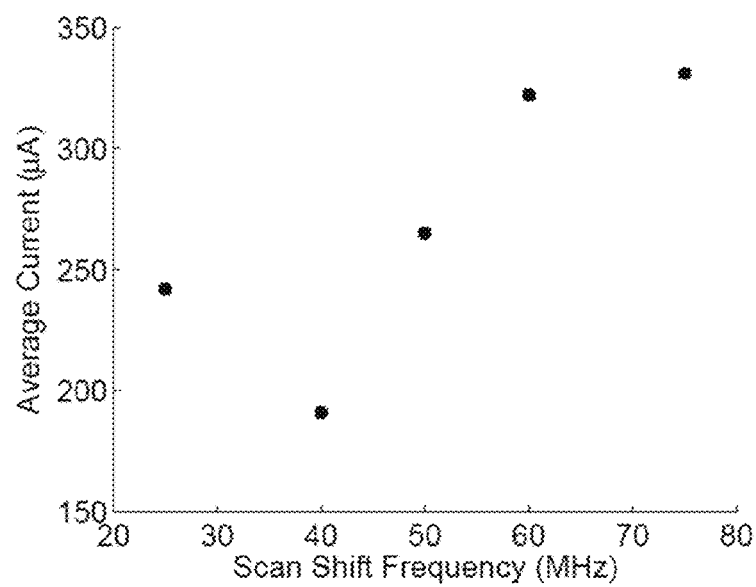
FIG. 7 shows a plot of average current drawn at 25, 40, 50, 60, and 75 MHz scan shift frequency.

FIG. 7 shows the current drawn for shifting in the stuck-at pattern and shifting out test responses at 25, 40, 50, 60, and 75 MHz shift frequency. At 50 MHz, current drawn averaged at around 300 μA and, at all frequencies, peaked at almost 1 mA for about a tenth of a nanosecond. For a high toggle-activity transition fault pattern using launch-off-shift and a 1 GHz functional clock, an average current of 432 μA is drawn during capture and peak current is similar as for stuck-at patterns.

It has been reported in the literature that a TSV can handle a current density higher than 70,000 A/cm$^2$. Published work on TSV reliability screening indicates that a sustained current density of 15,000 A/cm$^2$ is possible through a TSV without damage. To sustain a peak current of 1 mA through a single 5 μm TSV in the pre-bond test method would require the TSV to be capable of handling a current density of 5093 A/cm$^2$. To handle a 300 μA average current, a TSV must be capable of sustaining a current density of 1528 A/cm$^2$. Both these numbers are well below the maximum allowable current density.

In addition to the current density limits of the TSVs, the amount of current that the probe needles can deliver is considered. It has been shown in the literature that a 3 mil (76.2 μm) cantilever probe tip is capable of supplying 3 A of current for a short pulse time (less than 10 ms). In the worst case, assuming that all scan chains and logic in the benchmark draw the peak current at once, the probe tip would have to supply 3 A of current for less than 0.1 ns. This falls within the probe current-supply specification. If current supply from the probe is an issue, a variety of well-known methods can reduce peak and average test power on die during test, including partitioning the circuit into separate test modules, clock gating, and low-power patterns and it is contemplated that any suitable method may be incorporated into embodiments of the invention.

Test-time feasibility of the proposed method is also examined. The frequency at which scan-in and scan-out can take place depends on a number of factors. Scan-in speed depends on the strength of the probe-needle driver while scan-out depends on the strength of the TSV driver in the sending GSF used as a scan output. Both of these drivers must be able to charge and discharge the TSV network capacitance fast enough to meet the setup and hold times of the scan flops given the test clock frequency. Therefore, the number and capacitance of TSVs in a network also influences maximum scan clock frequency.

Simulations were performed assuming a probe card with 100 probe needles. Assuming that the TSV networks are roughly balanced, with the design containing 936 TSVs, a worse-case network of 11 TSVs was selected for simulation. This results in a network capacitance of 220 fF. For scan-out, two separate buffers were examined with W/L ratios of 4 and 6 to drive the TSV. Maximum scan-out frequencies were determined to be 50 MHz for the 4 W/L buffer and 98 MHz for the 6 W/L buffer. The probe driver is limited by the maximum current rating of the probe tip, delay of internal transmission gates to switch between driving and receiving, and probe-needle resistance. The maximum scan-in frequency was determined to be 185 MHz. These frequencies reflect typical scan shift frequencies, which tend to be significantly lower than functional clock frequencies.

Table 1 compares results between Die 0, Die 1, and Die 2. The worst-case stuck-at pattern current drawn was taken at 50 MHz. Since neither the driver strength nor the TSV network size were changed for these simulations, maximum scan-in and scan-out frequencies were equal for the dies.

TABLE 1

| Test Parameter | Die 0 | Die 1 | Die 2 |
|---|---|---|---|
| Peak Current | 1 mA | 1 mA | 1.1 mA |
| Avg. Current (stuck-at) | 300 µA | 294 µA | 327 µA |
| Avg. Current (transition) | 432 µA | 341 µA | 383 µA |
| Area Overhead | 2.2% | 1.0% | 1.2% |

Scan-test clock frequencies can remain relatively high even with the increased TSV network capacitance. The frequency can be tuned by adjusting the strength of drivers of the TSV network. The area overhead for incoporating the test architecture of embodiments of the invention was estimated to be between 1.0% and 2.2% for three dies with TSVs in a 4-die logic-on-logic 3D stack.

The effect of scan configuration on test time was examined. In particular, the configuration as described in FIG. 4A (one in which the scan I/Os for a scan chain are on the same TSV network, labeled as Configuration A) was compared with the conifguration as described in FIG. 5 (one in which the the scanI/Os for a scan chain are on separate networks, labeled as Configuration B). The scan frequency, scan chain length, number of scan chains, and number of TSV networks determine which configuration results in a lower test time.

For Die 0 of the 4-layer FFT benchmark (Die A in Table 1), if 50 scan chains are created, the result is a maximum scan chain length of 402 cells and 633 stuck-at test patterns. Assuming a probe card with 100 probe needles for contacting TSV networks, and further assuming that Configuration A utilizes the maximum scan-in (185 MHz) and scan-out (98 MHz) clock frequencies., configuration A requires 4.0 ms to complete stuck-at scan test. Configuration B, operating only at 98 MHz only, requires 2.6 ms since it can scan out test responses while scanning in the next test pattern.

It can be noted that Configuration A can use different scan-in and scan-out frequencies because these two shift operations are not performed in parallel. However, scan-in and scan-out are not overlapped.

If on the other hand, the die has 100 scan chains instead of 50, the maximum scan chain length is 202 cells and ATPG results in 640 stuck-at patterns. Since Configuration A can handle a maximum of 100 scan chains in a single touchdown, the die is contacted only once. This results in a test time of 2.0 ms. Configuration B requires two touchdowns; each time it is only capable loading and unloading 50 scan chains. It is assumed that the die is partitioned into separate test modules each of 50 scan chains such that coverage remains high. In this case, Configuration B requires 2.6 ms for test plus the time required align the probe card and for the second touchdown.

Advantageously, not all TSVs need to be contacted for die logic testing. This is an important advantage, especially if TSV or microbump damage due to probing is a concern. Table 2 shows what percentage of TSVs are contacted depending on the number of scan chains present on the die and the scan configuration used. The Table shows the results for Die 0 as a function of the number of scan chains and scan configuration.

TABLE 2

| Number of Scan Chains | % of TSVs to be Contacted | |
|---|---|---|
| | Configuration A | Configuration B |
| 25 | 2.7 | 5.3 |
| 50 | 5.3 | 10.7 |
| 75 | 8.0 | 16.0 |
| 100 | 10.7 | 21.4 |

As ilustrated by the examples, TSV probing can be used not only for pre-bond TSV test, but also for full-scan pre-bond die logic test. Scan chains can be reconfigured into a pre-bond state to use TSV networks for scan I/O while preserving significant test parallelism and not requiring many oversized probe pads.

Embodiments can deliver an appropriate amount of current through the TSVs and probe needles to the device under test during pre-bond scan test. Embodiments can charge and discharge the TSV networks at a speed within a reasonable range for providing a low pre-bond scan test time. By simply adding strategically placed MUX, the area overhead of embodiments of the invention can be minimized. According to embodiments, boundary scan registers are included in order to achieve high coverage in pre-bond scan test.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:
1. An on-chip test architecture comprising:
a scan chain for connecting to internal logic;
a receiving boundary scan flop for receiving post-bond scan input;
a sending boundary scan flop for receiving and outputting post-bond scan output;

a plurality of gated scan flops, each gated scan flop of the plurality of gated scan flops being connected to a corresponding through silicon via (TSV), wherein the plurality of gated scan flops comprises:
  a sending gated scan flop for receiving pre-bond scan output and outputting the pre-bond scan output through its connected TSV, and
  a receiving gated scan flop for receiving a pre-bond scan input through its connected TSV;
a first multiplexer (MUX) selectively connecting the receiving gated scan flop to an input of the scan chain; and
a second MUX selectively connecting an output of the scan chain to the sending gated scan flop.

2. The on-chip test architecture of claim 1, further comprising:
  a third MUX selectively connecting the sending gated scan flop and an output of the receiving gated scan flop to other boundary gated scan flops of the plurality of gated scan flops;
  a fourth MUX receiving a signal from the scan chain and outputting to the sending boundary scan flop.

3. The on-chip test architecture of claim 1, wherein the sending gated scan flop and the receiving gated scan flop are configured to be connected to TSVs of a same TSV network.

4. The on-chip test architecture of claim 1, wherein the sending gated scan flop and the receiving gated scan flop are configured to be connected to TSVs of different TSV networks.

5. The on-chip test architecture of claim 1, wherein each gated scan flop comprises:
  a scan flop receiving a clock signal input, a test input, a functional input, and a test select input; and providing a first signal at an output node; and
  an open signal controlled gate element at the output node of the scan flop, the gate element receiving the first signal from the scan flop and providing a Q output,
  wherein the gate element receives the open signal to control whether the Q output is floating or takes a value of the first signal,
  wherein each corresponding TSV is connected to receive a corresponding Q output.

6. The on-chip test architecture of claim 5, wherein the gate element comprises a transmission gate.

7. The on-chip test architecture of claim 5, wherein the gate element comprises a tri-state buffer, wherein a control input of the tri-state buffer receives the open signal.

8. The on-chip test architecture of claim 5, further comprising a controller configured to output the open signal to the gate element for each open signal controlled gate element of a TSV network, wherein a TSV network comprises a number of TSVs that can be contacted by a single probe needle, each of the TSVs being connected to receive a corresponding Q output via the open signal controlled gate element and pass an input to the gated scan flop.

9. A method of pre-bond testing of internal logic of a stacked integrated circuit using the on-chip test architecture of claim 1, the method comprising:
  applying a select signal to the first MUX and the second MUX to create a signal path for pre-bond testing of internal logic; and
  applying the pre-bond scan input through a probe needle contacting a plurality of TSVs including the TSV corresponding to the receiving gated scan flop.

10. The method of claim 9, further comprising:
  contacting the probe needle to a die under test, wherein the probe needle contacts the plurality of TSVs including the TSV corresponding to the receiving gated scan flop and the TSV corresponding to the sending gated scan flop;
  reading the pre-bond scan output from the probe needle.

11. The method of claim 10, wherein applying the pre-bond scan input comprises turning on the receiving gated scan flop for receiving the pre-bond scan input through its corresponding TSV; and
  wherein reading the pre-bond scan output from the probe needle comprises turning on the sending gated scan flop for outputting the pre-bond scan output through its connected TSV.

12. The method of claim 11, wherein each gated scan flop comprises a scan flop receiving a clock signal input, a test input, a functional input, and a test select input; and providing a first signal at an output node; and an open signal controlled gate element at the output node of the scan flop, the gate element receiving the first signal from the scan flop and providing a Q output, wherein the gate element receives the open signal to control whether the Q output is floating or takes a value of the first signal, the method comprising:
  turning on the receiving gated scan flop by setting the gate element of the receiving gated scan flop to a low-impedance state while other gated scan flops of the plurality of gated scan flops including the sending gated scan flop have gate elements set to a high-impedance state during the applying of the pre-bond scan input; and
  turning on the sending gated scan flop by setting the gate element of the sending gated scan flop to a low-impedance state while other gated scan flops of the plurality of gated scan flops including the receiving gated scan flop have gate elements set to a high-impedance state during the reading of the pre-bond scan output.

13. The method of claim 9, further comprising:
  contacting the probe needle to a die under test, wherein the probe needle contacts the plurality of TSVs;
  contacting a second probe needle to the die under test, wherein the second probe needle contacts a different plurality of TSVs including the TSV corresponding to the sending gated scan flop; and
  reading the pre-bond scan output from the second probe needle.

14. The method of claim 13, wherein applying the pre-bond scan input comprises turning on the receiving gated scan flop for receiving the pre-bond scan input through its corresponding TSV; and
  wherein reading the pre-bond scan output from the second probe needle comprises turning on the sending gated scan flop for outputting the pre-bond scan output through its connected TSV.

15. The method of claim 14, wherein each gated scan flop comprises a scan flop receiving a clock signal input, a test input, a functional input, and a test select input; and providing a first signal at an output node; and an open signal controlled gate element at the output node of the scan flop, the gate element receiving the first signal from the scan flop and providing a Q output, wherein the gate element receives the open signal to control whether the Q output is floating or takes a value of the first signal, the method comprising:
  turning on the receiving gated scan flop and the sending gated scan flop by setting the gate element of the receiving gated scan flop and the sending gated scan flop to a low-impedance state while other gated scan flops of the plurality of gated scan flops and the second plurality of gated scan flops have gate elements set to a high-impedance state.

16. The method of claim 15, wherein the applying of the pre-bond scan input and the reading of the pre-bond scan output are performed simultaneously.

\* \* \* \* \*